United States Patent [19]

Yang

[11] Patent Number: 4,843,331
[45] Date of Patent: Jun. 27, 1989

[54] COHERENT DIGITAL SIGNAL BLANKING, BIPHASE MODULATION AND FREQUENCY DOUBLING CIRCUIT AND METHODOLOGY

[75] Inventor: Steve S. Yang, Chatsworth, Calif.

[73] Assignee: Hughes Aircraft Company, Los Angeles, Calif.

[21] Appl. No.: 90,821

[22] Filed: Aug. 28, 1987

[51] Int. Cl.$^4$ ............................ H03K 7/10; H03K 19/00
[52] U.S. Cl. ...................................... 328/20; 307/471; 307/479; 307/271; 307/219.1; 328/55
[58] Field of Search ............... 342/175, 195, 202, 204; 328/20, 55, 58; 307/471, 219.1, 513, 271, 479, 543, 556; 377/47

[56] References Cited

U.S. PATENT DOCUMENTS

| | | | |
|---|---|---|---|
| 3,786,357 | 11/1974 | Bello Isle | 328/20 |
| 3,955,155 | 5/1976 | Behrend | 332/1 |
| 4,101,789 | 7/1978 | Ruhnau | 328/20 |
| 4,320,525 | 3/1982 | Woodward | 307/479 |
| 4,669,099 | 5/1987 | Zinn | 328/20 |
| 4,752,942 | 6/1988 | Iwakami | 328/72 |
| 4,775,805 | 10/1988 | Whitefoot | 307/471 |
| 4,777,447 | 10/1988 | Mueller | 307/525 |

FOREIGN PATENT DOCUMENTS 0154711 8/1985 Japan ................................... 377/47

*Primary Examiner*—Stanley D. Miller
*Assistant Examiner*—Tai V. Duong
*Attorney, Agent, or Firm*—R. A. Hays; C. D. Brown; A. W. Karambelas

[57] ABSTRACT

An information bearing signal (the object signal) for use in radar or radar-like circuitry is generated in a digital circuit and then converted through a bandpass matching filter into a corresponding analog signal. The object signal is then first combined in a NAND gate with a blanking control signal. In one embodiment, the selectively blanked object signal is frequency doubled by combining the blanked object signal and its quarter wave length shifted version in an EXCLUSIVE-OR gate. Thereafter, the frequency doubled version of the blanked object signal is combined in a second EXCLUSIVE-OR gate with a biphase modulation control signal which selectively inverts or noninverts the frequency doubled object signal. The output of the biphase modulated frequency doubled signal is then gated through a blanking NAND gate and coupled to the bandpass matching filter. In a second embodiment the blanked object signal is first combined in an EXCLUSIVE-OR gate with the biphase modulated control signal and therafter provided as an input to a second EXCLUSIVE-OR gate wherein it is combined with a quarter wave length version of the blanked object signal. The phase modulated frequency doubled signal is then coupled to a blanking NAND gate and bandpass matching filter as before. According to the values asserted for the biphase modulation control signal and blanking signal, the object signal is digitally frequency doubled, blanked and phase modulated as desired prior to conversion into analog form.

33 Claims, 3 Drawing Sheets

COHERENT DIGITAL SIGNAL BLANKING, BIPHASE MODULATION AND FREQUENCY DOUBLING CIRCUIT AND METHODOLOGY

BACKGROUND OF THE INVENTION

1. Field of the Invention

The field of the invention relates to circuitry and signal processing as used in radar exciters, radar receivers and similar types of equipment and in particular to digital circuitry functioning as an analog frequency doubler, biphase modulation and/or blanking switch.

2. Description of the Prior Art

In radar related circuitry, such as radar exciters, radar receivers and similar types of equipment, the need for doubling the frequency of an analog signal, of biphase modulating the signal and controllably blanking or switching the signal is commonplace. The prior art has devised many different types of circuits to perform these functions, which circuits are typically comprised of complicated multiple stages of analog circuitry.

For example, frequency doubling is presently practiced by generating higher harmonics of the fundamental frequency through amplifiers or step recovery diodes followed by appropriate filtration. Biphase modulation is typically achieved by modulating the low port of a double balanced mixer. Signal blanking is typically performed by circuitry based on the operation of diode blanking switches While the performance of the prior art circuits is acceptable, their design is complex, usually entailing a high number of component parts, corresponding high expense, low reliability and the inherent requirement of relatively long design times and trouble shooting periods.

Therefore, what is needed is a simple design which can be used in radar equipment which is capable of frequency doubling, biphase modulation and/or blanking without entailing any of these defects of the prior art, which is capable of producing a high fidelity output signal and which can be simply and inexpensively manufactured in a LSI chip or hybrid.

BRIEF SUMMARY OF THE INVENTION

The invention is a circuit for selectively blanking, biphase modulating and frequency doubling an object signal comprising an input terminal for receiving an input signal. The input signal is a function of the object signal. A delay line circuit is coupled to the input terminal and is provided for generating an output signal substantially identical to the input signal except that the output signal is shifted by approximately a quarter wave length. The delay can be introduced in a number of ways including the use of coax cable, strip line, digital gate propagation delay, and a capacitor-inductor (LC) delay. A second input terminal receives a biphase modulation control signal.

A first EXCLUSIVE-OR circuit is coupled to the first input terminal and to the second input terminal for selectively generating an output signal substantially equal to the object signal or its inverse depending upon the logic state of the biphase modulation control signal. A second EXCLUSIVE-OR circuit, having one input coupled to the output signal from the delay line circuit and a second input coupled to the output of the first EXCLUSIVE-OR circuit, generates a signal having a frequency twice the object signal in an inverted or noninverted state dependent upon the biphase modulation control signal. A third input terminal receives a blanking signal. A NAND (or NOR, depending on whether one uses transistor-transistor-logic, TTL, or Motorola-emitter-coupled-logic, MECL, circuits) blanking circuit, having one input coupled to the third input terminal, receives the blanking signal and has a second input coupled to the output of the second EXCLUSIVE-OR circuit. The NAND (or NOR) blanking circuit generates an output substantially identical to the output of the second EXCLUSIVE-OR circuit or an inactive output dependent upon the logic state of the blanking signal. As a result a digital circuit is provided for selectively blanking, biphase modulating and frequency doubling of the object signal.

The invention further comprises a bandpass matching filter circuit having an input coupled to the output of the NAND blanking circuit. The bandpass matching filter circuit transforms the digital input signal to an analog signal corresponding to the output of the NAND (or NOR) blanking circuit.

The invention still further comprises a NAND (or NOR) input gate circuit. The NAND (or NOR) input gate circuit has one input coupled to the object signal and a second input coupled to the blanking signal. The output of the NAND (or NOR) input gate circuit is coupled to the first input terminal. The NAND (or NOR) input gate circuit generates the input signal corresponding to the inverse of the object signal or an inactive output depending upon the state of the blanking signal.

The invention is also characterized as a circuit for selectively blanking, biphase modulating and frequency doubling an object signal comprising a digital circuit for doubling the frequency of the object signal; a digital circuit for generating a biphase modulated signal, and a digital circuit for blanking a signal. The digital circuit for generating the biphase modulated signal is coupled to the digital circuit for doubling the object signal. The object signal is thus doubled in frequency and is biphase modulated. The digital circuit for blanking is coupled to the digital circuit for doubling and generates the biphase modulated signal. The frequency doubled biphase modulated signal is thus selectively blanked. As a result, a simple digital circuit is provided for selectively blanking, biphase modulating and frequency doubling the object signal.

The circuit further comprises a bandpass matching filter circuit coupled to the digital circuit for blanking. The bandpass matching filter circuit generates an analog signal corresponding to the output of the digital circuit for blanking wherein the bandpass matching filter circuit generates an analog, frequency doubled, biphase controlled and blanked signal corresponding to the object signal.

The digital circuit for doubling the frequency of the object signal comprises a one-quarter wave period delay line circuit and an EXCLUSIVE-OR gate. The signal whose frequency is to be doubled is provided to the input of the delay line circuit and to one input of the EXCLUSIVE-OR gate. The other input of the EXCLUSIVE-OR gate is coupled to the output of the delay line circuit. The output of the EXCLUSIVE-OR gate is doubled in frequency with respect to the signal provided to the input of the delay line circuit.

The digital circuit for generating the biphase modulation comprises an EXCLUSIVE-OR gate having one input coupled to the output of the digital circuit for doubling the frequency of the object signal. The other output of the EXCLUSIVE-OR gate is coupled to a biphase modulation control signal.

In a second embodiment the digital circuit for doubling the frequency of the object signal comprises a one-quarter wave period delay line circuit and an EXCLUSIVE-OR gate. The signal whose frequency is to be doubled is provided to the input of the delay line circuit. One input of the EXCLUSIVE-OR gate is coupled to the output of the delay line circuit. The other input of the EXCLUSIVE-OR gate is coupled to the output of the digital circuit for generating the biphase modulation signal.

In this second embodiment the digital circuit for generating the biphase modulation signal comprises an EXCLUSIVE-OR gate having one input coupled to the signal whose frequency is to be doubled and a second input coupled to a biphase modulation control signal. The output of the EXCLUSIVE-OR gate is coupled to an input of the EXCLUSIVE-OR gate included within the digital circuit for doubling the frequency of the object signal.

In both embodiments the circuit also comprises a NAND (or NOR) gate having one input coupled to the object signal and a second input coupled to the blanking control signal. The NAND (or NOR) gate generates a signal whose frequency is to be doubled. The NAND (or NOR) gate is coupled to the digital circuit for doubling the frequency of the object signal.

The invention is also a method for selectively generating a blanked, biphase modulated and frequency doubled signal comprising the steps of: providing an object signal to the input of a one-quarter wave period delay line; generating a digital output signal from the delay line shifted by approximately 90 degrees with respect to the object signal; combining at least a function of the object signal with the delayed digital signal in an EXCLUSIVE-OR gate to generate a signal having a doubled frequency of the object signal; selectively modulating the phase of the signal having the doubled frequency; and selectively blanking the phase modulated doubled signal in response a to blanking control signal to produce a selectively blanked, phase modulated and frequency doubled digital output signal. As a result the output signal is digitally generated in a simplified digital circuit.

The method further comprises the step of generating an analog signal corresponding to the digital output signal. The analog signal corresponds to the digital output signal in frequency and phase.

In the step of combining the delayed signal and the function of the object signal, the function is the EXCLUSIVE-OR function of the object signal with a biphase modulating control signal.

In another embodiment, in the step of combining the delayed signal and the function of the object signal, the function is the identity function and where in the step of selectively phase modulating the frequency doubled signal, the phase of the frequency doubled signal is modulated in response to a phase modulation control signal combined with the frequency doubled signal in an EXCLUSIVE-OR gate.

The method further comprises the steps of generating a selectively blanked and inverted version of the object signal as the digital signal provided to the input of the delay line.

In one embodiment the step of frequency doubling the object signal is performed prior to selectively phase modulating the frequency doubled signal.

In another embodiment the step of selectively phase modulating the object signal is performed prior to frequency doubling the object signal.

The apparatus and methodology of the invention may further be characterized by the provision of a single blanking circuit or by the performance of a single step of blanking the object signal before any other circuit element operates upon the object signal.

More particularly the invention is a circuit for selectively blanking, biphase modulating and frequency doubling an object signal comprising an input terminal for receiving an input signal. The input signal is a function of the object signal. A delay line circuit is coupled to the input terminal and generates an output signal substantially identical to the input signal except that the output signal is shifted by approximately a one-quarter wave period. A second input terminal receives a biphase modulation control signal. A first EXCLUSIVE-OR circuit is coupled to the first input terminal and to the second input terminal and selectively generates an output signal substantially equal to the object signal or its inverse depending upon the logic state of the biphase modulation control signal. A second EXCLUSIVE-OR circuit has one input coupled to the output signal from the delay line circuit and a second input coupled to the output of the first EXCLUSIVE-OR circuit. The second EXCLUSIVE-OR circuit generates a signal having a frequency twice the frequency of the object signal in an inverted or noninverted state dependent upon the biphase modulation control signal. A third input terminal receives a blanking signal. A NAND input gate circuit has one input coupled to the object signal and a second input coupled to the blanking signal The output of the NAND input gate circuit is coupled to the first input terminal. The NAND input gate circuit generates the input signal corresponding to the inverse of the object signal or an inactive output depending upon the state of the blanking signal. As a result, a digital circuit is provided for selectively blanking, biphase modulating and frequency doubling of the object signal.

Similarly the invention can be alternatively described as a method for selectively generating a blanked, biphase modulated and frequency doubled signal from an object signal comprising the step of selectively blanking the object signal in response to a blanking control signal to produce a selectively blanked signal. The selectively blanked signal is provided to the input of a quarter wave length delay line. A delayed digital output signal is generated from the delay line and is shifted by approximately 90 degrees with respect to the selectively blanked signal. A logical function of the selectively blanked signal is combined with the delayed digital signal in an EXCLUSIVE-OR gate to generate a signal having a doubled frequency of the selectively blanked signal. The phase of the signal having the doubled frequency is selectively modulated to produce a final digital output signal.

The method may continue with the step of generating an analog signal corresponding to the final digital output signal. The analog signal corresponds to the final digital output signal in frequency and phase.

The invention may be better visualized in its illustrated embodiment by turning to the following drawings wherein like elements are referenced by like numerals.

BRIEF DESCRIPTION OF THE DRAWINGS

FIG. 1b is an alternative embodiment to the circuitry of FIG. 1a.

FIG. 2 is a timing diagram showing inputs, intermediate signals and outputs of the circuit of FIG. 1a.

FIG. 3b is an alternative embodiment to the circuitry of FIG. 3a.

FIG. 4 is a timing diagram showing the inputs, intermediate signals and outputs of the circuit of FIG. 3a.

The invention and its various embodiments may now be better understood by turning to the following detailed description.

DETAILED DESCRIPTION OF THE PREFERRED EMBODIMENTS

An information bearing signal (the object signal) for use in radar or radar-like circuitry is generated in a digital circuit and then converted through a bandpass matching filter into a corresponding analog signal. The object signal is then first combined in a NAND gate with a blanking control signal. In one embodiment, the selectively blanked object signal is frequency doubled by combining the blanked object signal and its one-quarter wave period shifted version in an EXCLUSIVE-OR gate. Thereafter, the frequency doubled version of the blanked object signal is combined in a second EXCLUSIVE-OR gate with a biphase modulation control signal which selectively inverts or noninverts the frequency doubled object signal. The output of the biphase modulated frequency doubled signal is then gated through a blanking NAND gate and coupled to the bandpass matching filter. In a second embodiment the blanked object signal is first combined in an EXCLUSIVE-OR gate with the biphase modulated control signal and thereafter provided as an input to a second EXCLUSIVE-OR gate wherein it is combined with a one-quarter wave period shifted version of the blanked object signal. The phase modulated frequency doubled signal is then coupled to a blanking NAND gate and bandpass matching filter as before. According to the values asserted for the biphase modulation control signal and blanking signal, the object signal is digitally frequency doubled, blanked and phase modulated as desired prior to conversion into analog form.

The invention utilizes characteristics of digital logic circuitry to generate a doubled output frequency, and a biphase modulated output, and to provide coherent blanking of an object signal. The operation of the circuitry is based upon the digital characteristics of two NAND gates, two EXCLUSIVE-OR gates, a delay line and bandpass filter.

Figure 1A:
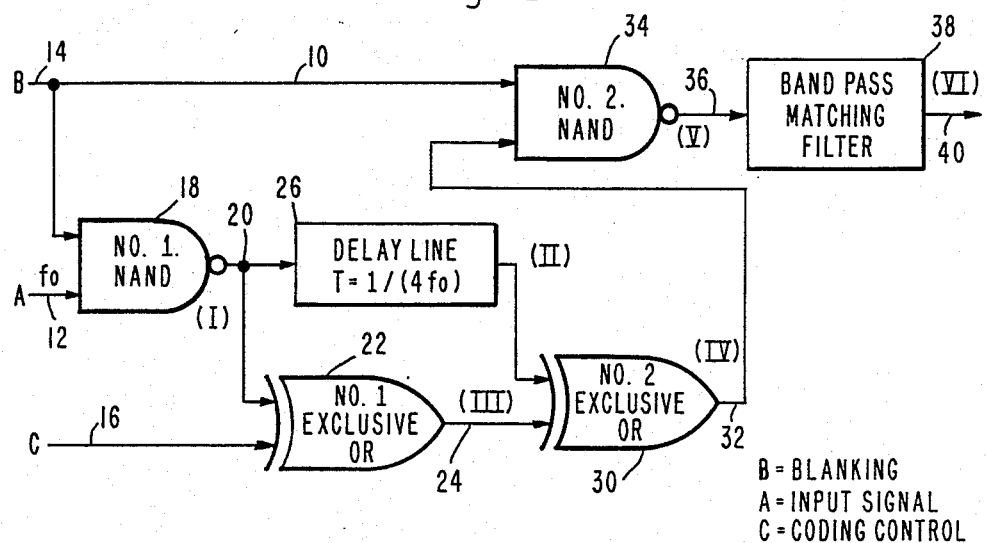
FIG. 1a is a schematic diagram of a first embodiment of the invention.

Turn now to the first embodiment of FIG. 1A wherein an object signal, f0, is provided at a fundamental frequency at input 12. What can be considered as a blanking or enabling signal is provided as signal B at input 14. A biphase control signal, C, is provided at input 16. Inputs 12 and 14 are each coupled to the input of NAND gate 18. Thus, the fundamental frequency f0 and the blanking signal B are combined in a NAND function and provided at output node 20. The signal at output node 20 is designated in the specification and in particular in the timing diagram of FIG. 2 as signal I.

Figure 2:
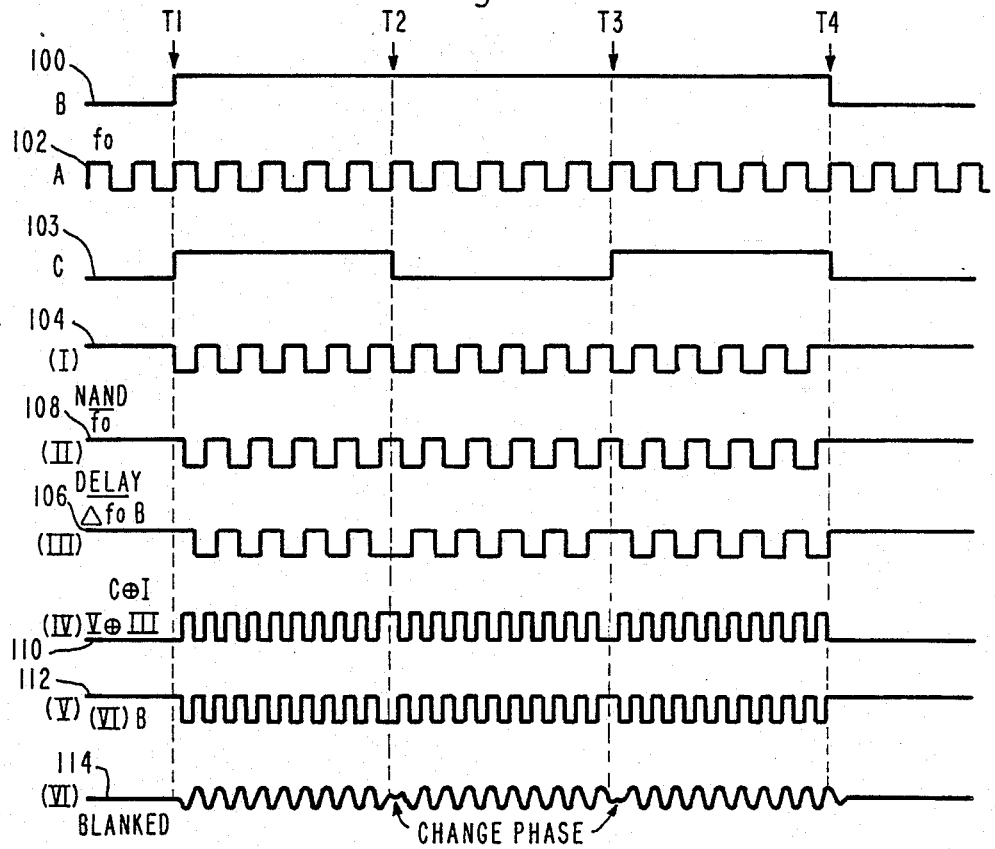

Turn now to FIG. 2, wherein four time periods T1–T4 are illustrated. The first line 100 symbolizes the blanking signal B. The second line 102 represents the object signal f0 In the illustrated embodiment, the frequency of the object signal f0 is ten times higher than blanking signal B. However, the two signals need not have this particular relationship and they may be arbitrarily related.

The output of NAND gate 18 is represented by signal I shown by line 104. Thus, when the blanking signal B is logically low, signal I is held high. When the blanking signal B is logically high, such as between times T1 And T4, the signal I is inverted.

Return now to FIG. 1A. The biphase control signal C provided at terminal 16 is provided as one input to EXCLUSIVE-OR gate 22, the other input of which is the intermediate signal I. The output signal of EXCLUSIVE-OR gate 22 is provided at node 24 and is designated in this specification as the intermediate signal III.

Turn now to the timing diagram of FIG. 2. The signal III is represented by line 106. Between the times T1 and T2 when the biphase control signal C is high, the signal III would be the inverse of signal I. During those times in which the biphase control signal C is logically low, signal III will be the same as the signal I. Alternatively stated, when the biphase control signal is high, the signal III will be equivalent to the signal I shifted by 180 degrees. However, the signal I is the inverse or the 180 degree shifted version of the object signal f0. Therefore, when the biphase control signal C is high, signal III is the same as the input signal. By similar reasoning, when the biphase control signal C is logically low, the signal III is 180 degrees shifted with respect to the input signal. Thus, signal III serves as the biphase modulated signal of the object signal f0 as responsively controlled by the biphase modulation control signal, C.

Returning again to FIG. 1A, the signal I of the output of node 20 is also provided as an input to a conventional delay line circuit 26. Delay line circuit 26 serves to delay the input signal by a quarter of its period. Therefore the output 28 of delay line 26 is designated within the specification as the intermediate signal II represented in the timing diagram of FIG. 2 by line 108. A brief comparison of the input signal I to delay line 26, as represented by line 104, to the output signal II from delay line 26, as represented by line 108, clearly shows the one-quarter wave period delay or shift of the output of delay line 26.

Output 28 of delay line 26 and signal III are provided as the inputs to a second EXCLUSIVE-OR gate 30. The output 32 of EXCLUSIVE-OR gate 30 is designated as the intermediate signal IV. Signal IV is represented in the timing diagram of FIG. 2 by the line 110. Since signal III is either 180 degrees out of phase with the input signal or is in phase with the input signal, it will always be 90 degrees out of phase with the quarter wavelength delayed signal II. Since the output signal IV of gate 30 will be high only if either one of the inputs to EXCLUSIVE-OR gate 30 is high, but not if both are high, the result is a doubled frequency output signal as depicted in line 110, which signal is appropriately phase shifted according to the value of biphase control signal C.

Output 32 of EXCLUSIVE-OR gate 30 and blanking signal B are provided as the inputs to a second NAND gate 34. The output 36 of NAND gate 34 is designated as the intermediate signal V and is represented in the timing diagram of FIG. 2 by line 112. Thus, the blanking signal can be considered as an enabling signal to NAND gate 34 which is disabled when active high as long as the blanking signal is logically low, and which otherwise provides an inverted output corresponding to the doubled frequency signal IV.

The signals discussed thus far have all been digital and processed in digital circuitry. However, in radar equipment analog signals are required. Therefore, output 36 of NAND gate 34 is provided to the input of a bandpass matching filter 38 having an output 40 designated by the signal VI. Signal VI is represented by line 114 in the timing diagram of FIG. 2. Bandpass filter 38 is used to recover the fundamental frequency of the output signal and reject higher order harmonics. The center frequency of bandpass filter 38 is 2f0. The bandwidth and phase characteristics of filter 38 are chosen according to well understood design principles so that any encoding on the object signal is maintained, such as phase modulated coding.

If a square wave signal is desired instead of an analog signal, the output can be taken directly from the output of 36 in NAND gate 34.

What results is a circuit which is comprised of simple digital logic NAND and EXCLUSIVE-OR gates plus a time delay which achieves circuit performances normally accomplished only by very complicated analog circuits.

Figure 3B:
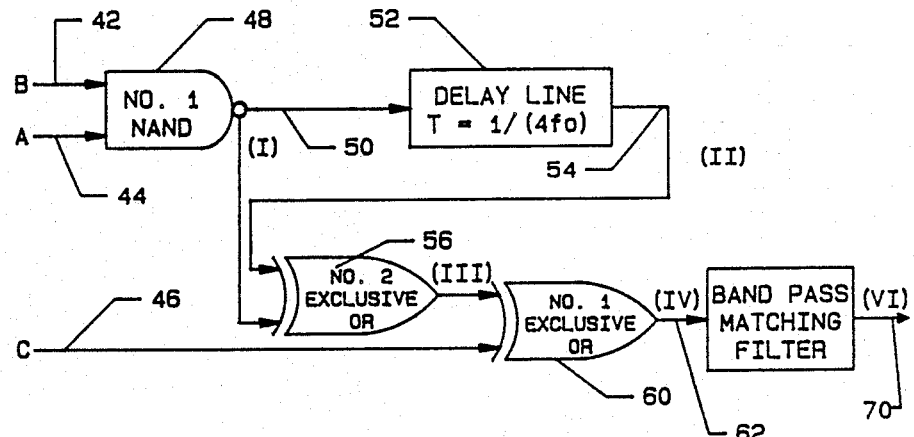
Figure 3A:
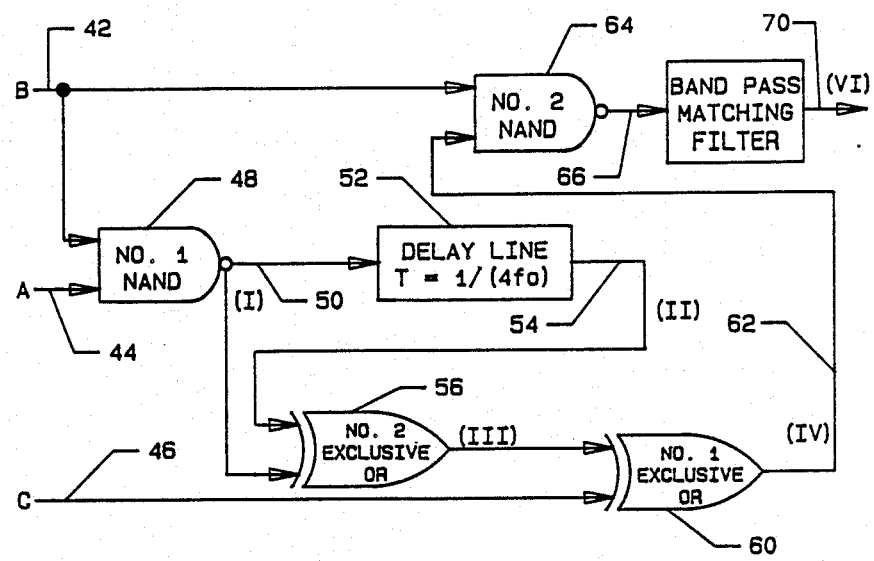
FIG. 3a is a schematic diagram of a second embodiment of the invention.
Figure 4:
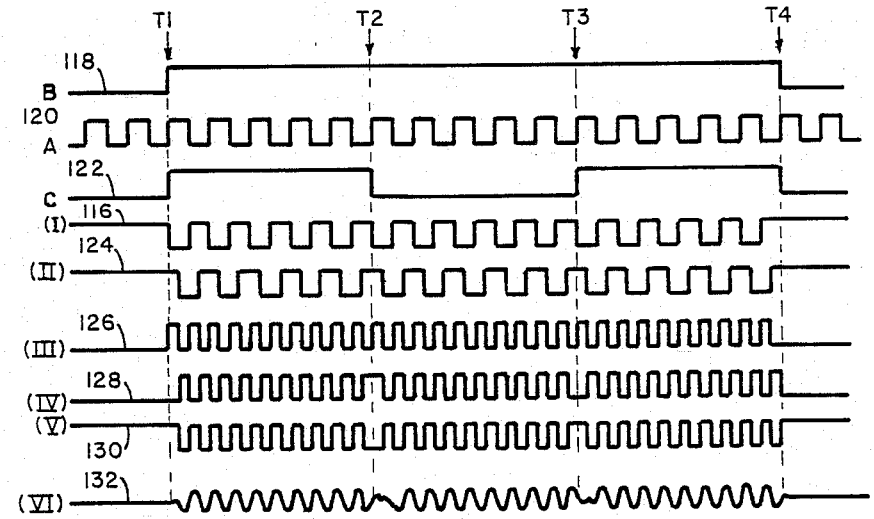

Additional embodiments of the invention may be devised. FIG. 3A illustrates one such additional embodiment. As before, FIG. 3A has a blanking signal input B provided at terminal 42, an object signal f0 provided at terminal 44, and a biphase modulation control signal at input 46. Blanking signal B and the input signal f0 are provided as inputs to a first NAND gate 48 whose output 50 is designated as the intermediate signal I represented by the waveform on line 116 of the timing diagram of FIG. 4. Line 118 represents the blanking signal B, line 120 the input signal f0 and line 122 the biphase modulation control signal C. The frequency relationship between the signals B, C and f0 are the same as shown in connection with the illustrated embodiment of FIGS. 1 and 2. However, it must be understood that these signals may have an arbitrary relationship with each other. In FIG. 3A the blanking signal B acts as an enabling signal for NAND gate 48 which either passes an inactive logic high or the inverted input signal to its output 50. Output 50 is coupled to delay line circuit 52 similar to delay line circuit 26 of the embodiment of FIG. 1A. Delay line circuit 52 has an output at 54 designated as signal II and is represented by line 124 in the timing diagram of FIG. 4. Again this is simply a 90 degree, phase shifted version of the signal I. The output 54 of delay line circuit 52 is provided together with signal I as the inputs to an EXCLUSIVE-OR gate 56. Output 58 of EXCLUSIVE-OR gate 56 is represented by line 126 in FIG. 4 and designated as the signal III. As before, the EXCLUSIVE-ORed combination of a signal together with its 90 degree phase shifted counterpart produces a signal having a doubled frequency. The signal III and the biphase control signal C at terminal 46 are each provided as inputs to EXCLUSIVE-OR gate 60. Output 62 of EXCLUSIVE-OR gate 60 is designated as signal IV and is represented by line 128 in FIG. 4. Thus, output 62 of EXCLUSIVE-OR gate 60 will either be the inverted version of signal III, in the case where the biphase control signal is logically high, or the same as the input signal III in the case where the biphase control signal C is logically low.

Output 62 of EXCLUSIVE-OR gate 60 is provided as an input together with the blanking signal B to a second NAND gate 64. Output 66 of NAND gate 64 is designated as signal V represented by line 130 of the timing diagram of FIG. 4. The blanking signal B is provided as an enabling signal for NAND gate 64 whose output, when enabled, is the inverse of signal IV.

As before, output 66 of NAND gate 64 is provided to a bandpass matching filter 68 with an output 70. Output 70 of filter 68 is designated as signal VI, represented by line 132 in FIG. 4. Bandpass matching filter 68 is similar to bandpass filter 38 described in connection with FIG. 1A. Its output is signal VI as shown on line 132 of FIG. 4 and is a sinusoidal signal at the fundamental frequency which is phase controlled according to the state of signal C and blanked according to the state of signal B. The frequency of signal IV is also double that of the input frequency.

Blanking within the embodiments described above is very efficient because all the logic functions stop and stay either at a logical high or low and there is only one information bearing signal, f0, existing in the entire system. The output signal frequency is twice the input signal frequency. Therefore, there is no output frequency residual when the system is blanked except for such second harmonic that may exist of the input frequency, f0. If the input frequency is a square wave as shown in the illustrated embodiment, the second harmonic will be at least 40 dB below the fundamental level of f followed by three stages of gate isolation, and the second harmonic leakage of f0 at the output will be at least 100 dB below the magnitude of the output signal.

Figure 1B:
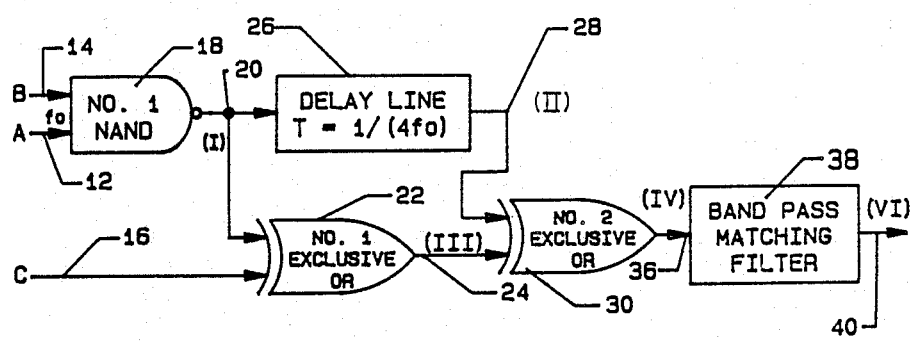

In the event that the input-output isolation in either NAND gate 34 or 64 in FIGS. 1a and 3a respectively is unacceptable, this gate and the corresponding connection from the B input 14 or 42 respectively can be deleted and the coupling from EXCLUSIVE-OR gate 30 or 60 to bandpass matching filter 38 or 68 respectively made directly as shown in FIGS. 1a and 3a. Blanking in this case is effected through NAND gate 18 or 48 respectively and the elements as well as the performance of the overall circuitry of FIG. 1b and FIG. 3b is analogous to FIG. 1a and FIG. 3a respectively as described above and will not be repeated.

Many modifications and alterations may be made by those having ordinary skill in the art without departing from the spirit and scope of the invention. Therefore, the illustrated embodiment is shown only for the purposes of example and it should not be taken as limiting the scope of the invention which is defined in the following claims.

I claim:

1. A circuit for selectively blanking, biphase modulating and frequency doubling an object signal comprising:
digital circuit means for doubling the frequency of said object signal;
digital circuit means for generating a biphase modulated signal, said digital circuit means for generating said biphase modulated signal being coupled to said digital circuit means for doubling said object signal, wherein said object signal is doubled in frequency and biphase modulated;
digital circuit means for blanking a signal, said digital circuit means for blanking being coupled to said digital circuit means for doubling and to said digital circuit means for generating said biphase modulated signal, wherein said frequency doubled biphase modulated signal is selectively blanked, whereby a simple digital circuit is provided for selectively blanking, biphase modulating and frequency doubling said object signal.

2. The circuit of claim 1 further comprising bandpass matching filter means coupled to said digital circuit means for blanking, said bandpass matching filter means for generating an analog signal corresponding to the output of said digital circuit means for blanking wherein said bandpass matching filter means generates an analog, frequency doubled, biphase controlled and blanked signal corresponding to said object signal.

3. The circuit of claim 1 wherein said digital circuit means for doubling the frequency of said object signal comprises a quarter wave length delay line circuit and an EXCLUSIVE-OR gate, a signal whose frequency is to be doubled being provided to the input of said delay line circuit and to one input of said EXCLUSIVE-OR gate, the other input of said EXCLUSIVE-OR gate being coupled to the output of said delay line circuit, the output of the said EXCLUSIVE-OR gate being doubled in frequency with respect to said signal provided to the input of said delay line circuit.

4. The circuit of claim 3 wherein said digital circuit means for generating said biphase modulation comprises an EXCLUSIVE-OR gate having one input coupled to the output of said digital circuit means for doubling the frequency of said object signal, the other output of said EXCLUSI\ E-OR gate being coupled to a biphase modulation control signal.

5. The circuit of claim 1 wherein said digital circuit means for doubling the frequency of said object signal comprises a quarter wave length delay line circuit and an EXCLUSIVE-OR gate, the signal whose frequency is to be doubled being provided to the input of said delay line circuit, one input of said EXCLUSIVE-OR gate being coupled to the output of said delay line circuit, the other input of said EXCLUSIVE-OR gate being coupled to the output of said digital circuit means for generating said biphase modulation signal.

6. The circuit of claim 5 wherein said digital circuit means for generating said biphase modulation signal comprises an EXCLUSIVE-OR gate having one input coupled to said signal whose frequency is to be doubled and a second input coupled to a biphase modulation control signal, the output of said EXCLUSIVE-OR gate being coupled to an input of said EXCLUSIVE-OR gate included within said digital circuit means for doubling the frequency of said object signal.

7. The circuit of claim 1 wherein said digital circuit means for doubling comprises a NAND gate having one input coupled to said object signal and a second input coupled to the blanking control signal, said NAND gate generating a signal whose frequency is to be doubled, said NAND gate coupled to the input of said digital circuit means for doubling the frequency of said object signal.

8. The circuit of claim 4 wherein said digital circuit means for doubling comprises a NAND gate having one input coupled to said object signal and a second input coupled to the blanking control signal, said NAND gate generating a signal whose frequency is to be doubled, said NAND gate coupled to the input of said digital circuit means for doubling the frequency of said object signal.

9. The circuit of claim 6 wherein said digital circuit means for doubling comprises a NAND gate having one input coupled to said object signal and a second input coupled to the blanking control signal, said NAND gate generating a signal whose frequency is to be doubled, said NAND gate coupled to the input of said digital circuit means for doubling the frequency of said object signal.

10. A circuit for selectively blanking, biphase modulating and frequency doubling an object signal comprising:

an input terminal for receiving an input signal, said input signal being a function of said object signal, said input signal, where unblanked, having the same frequency as said object signal;

delay lines means coupled to said input terminal for generating an output signal substantially identical to said input signal except that said output signal is shifted by approximately a one-quarter wave period;

a second input terminal for receiving a biphase modulation control signal;

first EXCLUSIVE-OR means coupled to said first input terminal and to said second input terminal for selectively generating an output signal substantially equal to said object signal or its inverse depending upon the logic state of said biphase modulation control signal;

second EXCLUSIVE-OR means having one input coupled to said output signal from said delay line means and a second input coupled to said output of said first EXCLUSIVE-OR means, said second EXCLUSIVE-OR means for generating a signal having a frequency twice the frequency of said object signal in an inverted or noninverted state dependent upon said biphase modulation control signal;

a third input terminal for receiving a blanking signal; and

NAND blanking means having one input coupled to said third input terminal for receiving said blanking signal and having a second input coupled to said output of said second EXCLUSIVE-OR means, said NAND blanking means for generating an output substantially identical to said output of said second EXCLUSIVE-OR MEANS OR AN inactive output dependent upon the logic state of said blanking signal;

whereby a digital circuit is provided for selectively blanking, biphase modulating and frequency doubling of said object signal.

11. The circuit of claim 1 further comprising a bandpass matching filter means having an input coupled to said output of said NAND blanking means, said bandpass matching filter means for generating an analog signal corresponding to said output of said NAND blanking means.

12. The circuit of claim 1 further comprising a NAND input gate means, said NAND input gate means having one input coupled to said object signal and a second input coupled to said blanking signal, the output of said NAND input gate means being coupled to said first input terminal, said NAND input gate means for generating said input signal corresponding to the inverse of said object signal or an inactive output depending upon the state of said blanking signal.

13. The circuit of claim 11 further comprising a NAND input gate means, said NAND input gate means having one input coupled to said object signal and a second input coupled to said blanking signal, the output of said NAND input gate means being coupled to said first input terminal, said NAND input gate means for generating said input signal corresponding to the inverse of said object signal or an inactive output depending upon the state of said blanking signal.

14. A method for selectively generating a blanked biphase modulated and frequency doubled signal comprising the steps of:
providing an object signal to the input of a quarter wave length delay line;
generating a digital output signal from said delay line shifted by approximately 90 degrees with respect to said object signal;
combining at least a function of said object signal with said delayed digital signal in an EXCLUSIVE-OR gate to generate an EXCLUSIVE-OR gate output signal having a doubled frequency of said object signal;
selectively modulating the phase of said EXCLUSIVE-OR gate signal having said doubled frequency; and
selectively blanking said phase modulated frequency doubled signal in response to a blanking control signal to produce a selectively blanked, phase modulated and frequency doubled digital output signal,
whereby said output signal is digitally generated in a simplified digital circuit.

15. The method of claim 14 further comprising the step of generating an analog signal corresponding to said digital output signal, said analog signal corresponding to said digital output signal in frequency and phase.

16. The method of claim 14 where in said step of combining said delayed signal and said function of said object signal, said function is the EXCLUSIVE-OR function of said object signal with a biphase modulating control signal.

17. The method of claim 14 where in said step of combining said delayed signal and said function of said object signal, said function is the identity function and where in said step of selectively phase modulating said frequency doubled signal, said phase of said frequency doubled signal is modulated in response to a phase modulation control signal combined with said frequency doubled signal in an EXCLUSIVE-OR gate.

18. The method of claim 14 further comprising the steps of generating a selectively blanked and inverted version of said object signal as said digital signal provided to said input of said delay line.

19. The method of claim 14 where said step of frequency doubling said object signal is performed prior to selectively phase modulating said frequency doubled signal.

20. The method of claim 14 where said step of selectively phase modulating said object signal is performed prior to frequency doubling said object signal.

21. A circuit for selectively blanking, biphase modulating and frequency doubling an object signal comprising:
an input terminal for receiving an input signal, said input signal being a function of said object signal; said input signal, when unblanked, having the same frequency as said object signal;
delay line means coupled to said input terminal for generating an output signal substantially identical to said input signal except that said output signal is shifted by approximately a one-quarter wave period;
a second input terminal for receiving a biphase modulation control signal;
first EXCLUSIVE-OR means coupled to said first input terminal and to said second input terminal for selectively generating an output signal substantially equal to said object signal or its inverse depending upon the logic state of said biphase modulation control signal;
second EXCLUSIVE-OR means having one input coupled to said output signal from said delay line means and a second input coupled to said output of said first EXCLUSIVE-OR means, said second EXCLUSIVE-OR means for generating a signal having a frequency twice the frequency of said object signal in an inverted or noninverted stage dependent upon said biphase modulation control signal;
a third input terminal for receiving a blanking signal; and
a NAND input gate means, said NAND input gate means having one input coupled to said object signal and a second input coupled to said blanking signal, the output of said NAND input gate means being coupled to said first input terminal, said NAND input gate means for generating said input signal corresponding to the inverse of said object signal or an inactive output depending upon the state of said blanking signal,
whereby a digital circuit is provided for selectively blanking, biphase modulating and frequency doubling of said object signal.

22. A circuit for selectively blanking, biphase modulating and frequency doubling an object signal comprising:
digital circuit means for doubling the frequency of said object signal;
digital circuit means for generating a biphase modulated signal, the input of said digital circuit means for generating said biphase modulated signal being coupled to the output of said digital circuit means for doubling said object signal, wherein said object signal is doubled in frequency and biphase modulated;
digital circuit means for blanking a signal, said digital circuit means for blanking being coupled to said digital circuit means for doubling and to said digital circuit means for generating said biphase modulated signal, wherein said frequency doubled biphase modulated signal is selectively blanked,
whereby a simple digital circuit is provided for selectively blanking, biphase modulating and frequency doubling said object signal.

23. The circuit of claim 22 wherein said digital circuit means for doubling the frequency of said object signal comprises a quarter wave length delay line circuit and an EXCLUSIVE-OR gate, a signal whose frequency is to be doubled being provided to the input of said delay line circuit and to one input of said EXCLUSIVE-OR gate, the other input of said EXCLUSIVE-OR gate being coupled to the output of said delay line circuit, the output of the said EXCLUSIVE-OR gate being doubled in frequency with respect to said signal provided to the input of said delay line circuit.

24. The circuit of claim 23 wherein said digital circuit means for generating said biphase modulation comprises an EXCLUSIVE-OR gate having one input coupled to the output of said digital circuit means for doubling the frequency of said object signal, the other input of said EXCLUSIVE-OR gate being coupled to a biphase modulation control signal.

25. The circuit of claim 22 wherein said digital circuit means for doubling the frequency of said object signal comprises a quarter wave length delay line circuit and an EXCLUSIVE-OR gate, the signal whose frequency is to be doubled being provided to the input of said delay line circuit, one input of said EXCLUSIVE-OR gate being coupled to the output of said delay line circuit, the other input of said EXCLUSIVE-OR gate being coupled to the output of said digital circuit means for generating said biphase modulation signal.

26. The circuit of claim 25 wherein said digital circuit means for generating said biphase modulation signal comprises an EXCLUSIVE-OR gate having one input coupled to said signal whose frequency is to be doubled and a second input coupled to a biphase modulation control signal, the output of said EXCLUSIVE-OR gate being coupled to an input of said EXCLUSIVE-OR gate included within said digital circuit means for doubling the frequency of said object signal.

27. The circuit of claim 22 wherein said digital circuit means for blanking comprises a NAND gate having one input coupled to said object signal and a second input coupled to the blanking control signal, said NAND gate generating a signal whose frequency is to be doubled, said NAND gate coupled to said digital circuit means for doubling the frequency of said object signal.

28. A method for selectively generating a blanked, biphase modulated and frequency doubled signal from an object signal comprising the steps of:
    selectively blanking said object signal in response to a blanking control signal to produce a selectively blanked signal;
    providing said selectively blanked signal to the input of a quarter wave length delay line;
    generating a delayed digital output signal from said delay line shifted by approximately 90 degrees with respect to said selectively blanked signal;
    combining at least a function of said selectively blanked signal with said delayed digital signal in an EXCLUSIVE-OR gate to generate a signal having a doubled frequency fos said selectively blanked signal; and
    selectively modulating, in response to a modulation control signal, the phase of said signal having said doubled frequency to produce a final digital output signal,
    whereby said output signal is digitally generated in a simplified digital circuit.

29. The method of claim 28 further comprising the step of generating an analog signal corresponding to said final digital output signal, said analog signal corresponding to said final digital output signal in frequency and phase.

30. The method of claim 28 where in said step of combining said delayed signal and said function of said selectively blanked signal, said function is the EXCLUSIVE-OR function of said selectively blanked signal with a biphase modulating control signal.

31. The method of claim 28 wherein said step of combining said delayed signal and said function of said selectively blanked signal, said function is the identity function and where in said step of selectively phase modulating said frequency doubled signal, said phase of said frequency doubled signal is modulated in response to a phase modulation control signal combined with said frequency doubled signal in an EXCLUSIVE-OR gate.

32. The method of claim 28 where said step of frequency doubling said selectively blanked signal is performed prior to selectively phase modulating said frequency doubled signal.

33. The method of claim 28 wherein said step of selectively phase modulating said selectively blanked signal is performed prior to frequency doubling said selectively blanked signal.

* * * * *